United States Patent [19]

Beatty

[11] Patent Number: 5,784,594
[45] Date of Patent: Jul. 21, 1998

[54] GENERIC INTERACTIVE DEVICE MODEL WRAPPER

[75] Inventor: Paul E. Beatty, Leesport, Pa.

[73] Assignee: Lucent Technologies Inc., Murray Hill, N.J.

[21] Appl. No.: 664,020

[22] Filed: Jun. 12, 1996

[51] Int. Cl.⁶ ............................................. G06F 9/455
[52] U.S. Cl. ............................................. 395/500
[58] Field of Search .......................... 364/578; 395/500

[56] References Cited

U.S. PATENT DOCUMENTS

| | | | |
|---|---|---|---|
| 4,635,218 | 1/1987 | Widdoes, Jr. | 364/578 |
| 5,352,123 | 10/1994 | Sample et al. | 439/61 |
| 5,448,496 | 9/1995 | Butts et al. | 364/489 |
| 5,452,231 | 9/1995 | Butts et al. | 364/489 |
| 5,625,580 | 4/1997 | Read et al. | 364/578 |

*Primary Examiner*—Kevin J. Teska
*Assistant Examiner*—Dan Fiul

[57] ABSTRACT

A cost effective mechanism for integrating device models into vendor simulation environments. A generic model wrapper accesses the device model's symbol table and interfaces with the host simulator interface to align the interface signals at initialization/powerup of the device model. In addition, the generic wrapper provides integration flexibility from device to device, and from simulation environment to simulation environment by isolating the specific tasks of the simulation environment at a low level and allowing for the plugging-in of new primitives for each new simulation environment. As a result, the generic wrapper provides a single integration layer for any IDM in any simulation environment without hard-coding the alignment therebetween.

43 Claims, 2 Drawing Sheets

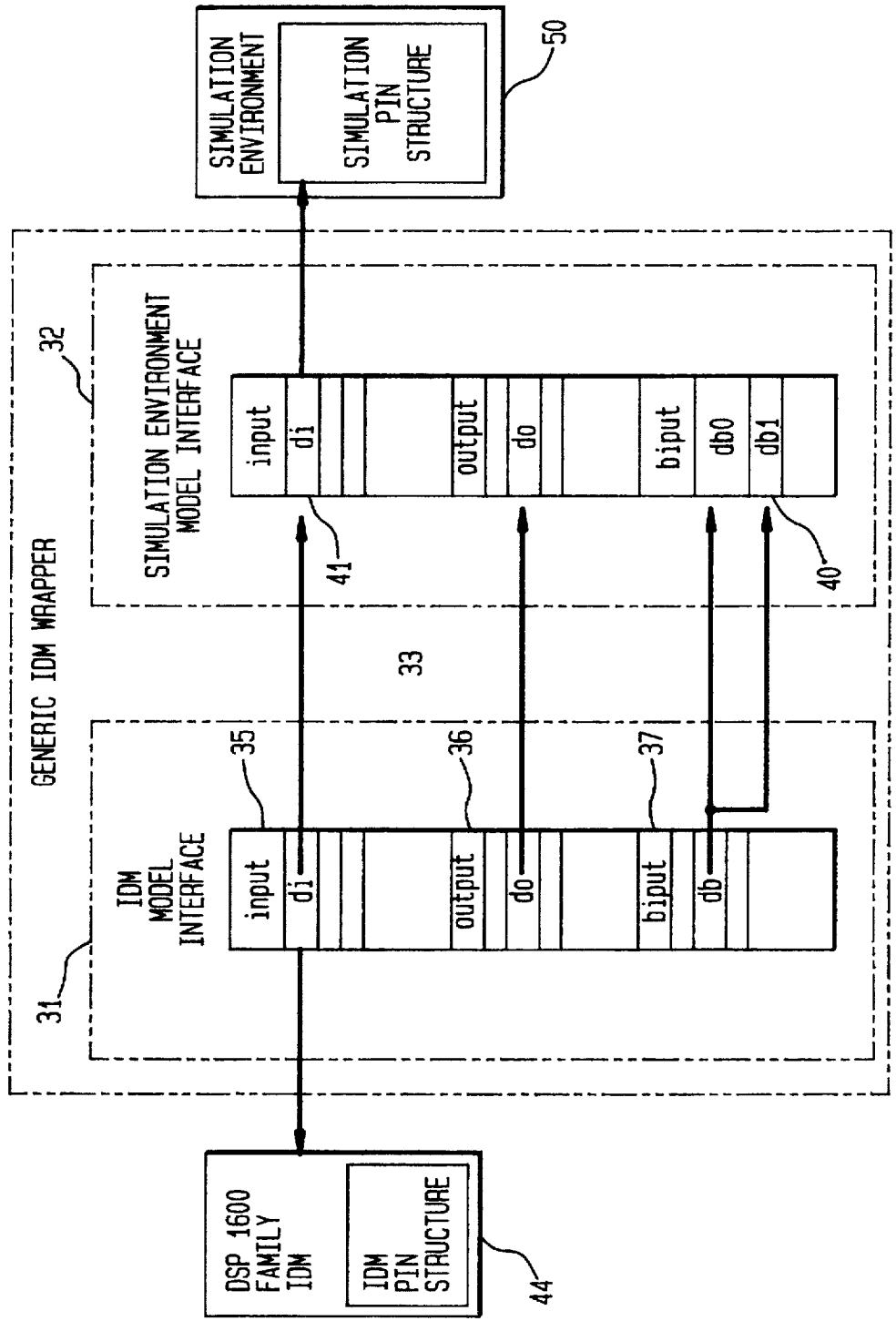

GENERIC INTERACTIVE DEVICE MODEL WRAPPER

FIELD OF THE INVENTION

This invention relates in general to the field of device simulation, and more particularly to the integration of device models into simulation environments.

BACKGROUND OF THE INVENTION

The task of integrating an interactive device model (IDM), such as a software model of a digital signal processor, into an outside framework (i.e. a simulation environment) is called model wrapping. A model wrapper is basically a layer of software that translates the signal description of the device model into the signal description of the simulation environment, and vice versa, for all the interface pins defined for the model.

Heretofore, the mechanism for integrating device models into simulation environments has been to create a separate wrapper for each model. As a result, each wrapper of the prior art is essentially hard-coded to provide a mapping between the interface pins of one particular device model and the interface pins of one particular simulation environment. Thus, the custom wrapper of the prior art provides for the integration of one particular device model in only one simulation environment. Consequently, according to the prior art, the number of wrappers required to integrate each available device model into all the available simulation environments converges on the number of available supported devices multiplied by the number of supported platforms.

As a result, prior art wrappers are costly, and thus undesirable to those interested in testing a plurality of device models in one simulation environment, and to those interested in testing a particular device model in a plurality of simulation environments. The present invention addresses these problems.

SUMMARY OF THE INVENTION

Accordingly, the present invention is directed to a cost effective mechanism for integrating device models into vendor simulation environments. To attain this, the present invention provides a generic model wrapper which provides the means for integrating any device model into many different simulation environments.

The generic wrapper provides integration for different devices by querying or interfacing with the symbol table of the device model and the host simulator interface to align the interface signals therebetween during initialization/powerup of the device model, rather than hard-coding the alignment as with traditional wrappers. In addition, the generic wrapper provides integration flexibility from simulation environment to simulation environment by isolating the specific tasks of the simulation environment at a low level and allowing for the substitution of new primitives (i.e. a set of details that enables the translation of signals into and out of the environment) for each new simulation environment. As a result, the generic wrapper provides a single integration layer for any IDM in any simulation environment without hard-coding the alignment therebetween. Thus, the present invention overcomes to a large extent the limitations associated with the prior art.

These and other features of the invention are described in more complete detail in the following description of illustrative embodiments of the invention when taken with the drawings. The scope of the invention, however, is limited only by the claims appended hereto.

BRIEF DESCRIPTION OF THE DRAWINGS

FIG. 3 shows a block diagram of the interface connections established by the wrapper of the present invention between a DSP 1600 family IDM and a simulation environment.

DETAILED DESCRIPTION OF ILLUSTRATIVE EMBODIMENTS OF THE INVENTION

Figure 1:
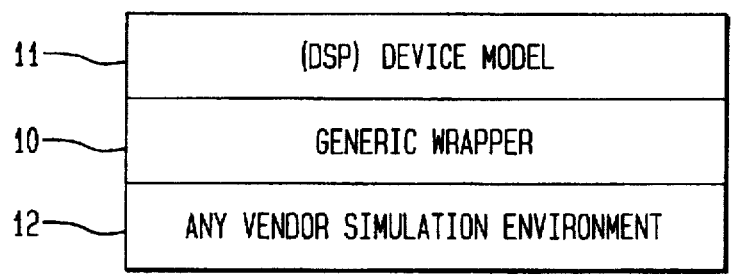
FIG. 1 shows a block diagram of the software layering of a typical embodiment of the generic wrapper between a device model and a simulation environment.

Referring now to FIG. 1, there is shown a block diagram of the software layering of one embodiment of the wrapper of the present invention, hereinafter referred to as wrapper 10. As shown, wrapper 10 provides a means for integrating a digital signal processor (DSP) model 11, representing a given DSP, into simulation environment 12, which may be provided by any vendor, to evaluate the performance of the given DSP in simulation environment 12. DSP model 11 and simulation environment 12 each have an interface with a predetermined pin structure. DSP model 11 and simulation environment 12 have references which provide access to pin values in DSP model 11 and simulation environment 12, respectively. These references provide the wrapper 10 with the information necessary to access the pin/signal value between the DSP model 11 and the simulation environment 12.

In general, wrapper 10 performs two important functions in the integration process. First, wrapper 10 establishes a mapping between interface pins of DSP model 11 and interface pins of simulation environment 12. Then, wrapper 10 uses the mapping to translate pin information flowing between DSP model 11 and simulation environment 12.

To establish the mapping, wrapper 10 queries DSP model 11 and interfaces with simulation environment 12 for pin names, and then aligns the pins of the two devices based on these pin names. Wrapper 10 uses the DSP model 11 and simulation environment 12 references to transfer pin values between the two. All the pin alignment data and the reference data is stored by wrapper 10 in DSP model 11 for use during model evaluation.

When an input pin transitions, evaluation of DSP model 11 begins. At this time, wrapper 10 copies each simulation environment input pin signal and any biput pin, configured as an input pin, signal to DSP model 11. A biput pin is a pin which may be configured as an input or an output. This transfer is guided by the mapping information described above. Wrapper 10 uses a simulation environment 12 routine to obtain the input signal value. After which, wrapper 10 translates the simulation environment signal into a signal representation or description of DSP model 11. In addition, wrapper 10 packs simulation environment 12 bus signals into the appropriate compact DSP model bus representation.

After all of the new data coming into DSP model 11 has been transferred, wrapper 10 executes DSP model 11 to evaluate itself based on the new input values. DSP model 11 then completes the evaluation and outputs a new set of values. Wrapper 10 compares these new outputs to outputs from a previous evaluation of DSP model 11, and then drives only those outputs and biputs (configured as outputs), that have changed since the previous evaluation, into simulation environment 12. The driving of the changed data into simulation environment 12 are performed through simulation environment specific routines. During this process, any compacted DSP bus signals are unpacked as required.

Figure 2:
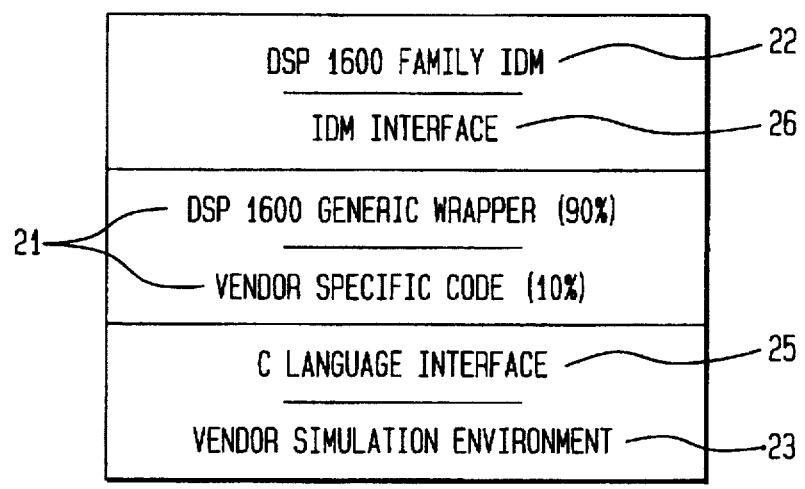
FIG. 2 shows a block diagram of a generic model wrapper of the present invention interfacing between a digital signal processor (DSP) 1600 family device model and a simulation environment.

In FIG. 2 there is shown one environment using a wrapper according to the present invention, wherein wrapper 21 is used to integrate a device model such as a DSP 1600 family—IDM or IDM 22 into a vendor simulation environment 23. As shown, wrapper 21 interfaces between the simulation environment's C language interface 25 and an IDM interface 26. Wrapper 21 connects and transfers the pin information from IDM 22 to simulation environment 23, and vice versa, in two steps.

First, at elaboration or startup, the connections are established. That is, based on the names of the pins of IDM 22, wrapper 21 connects the IDM 22 pins to the corresponding simulation environment 23 pins by taking each IDM 22 pin name and searching for a similar pin name in the list of simulation environment 23 pins. This pin name matching establishes a mapping of the simulation environment 23 pins to the IDM 22 pin for signal transfer therebetween. As a result, the pin mapping is used during device evaluation (i.e. evaluation of IDM 22 in simulation environment 23).

Second, during device simulation, wrapper 21 uses the mapping information to transfer data into and out of IDM 22 and the simulation environment format. For example, wrapper 21 uses the mapping information to transfer input values from the simulation environment into the corresponding IDM 22 pin values. In addition, wrapper 21 maps the logic levels of simulation environment 22 to the corresponding IDM values.

To establish the connections and make the transfer, wrapper 21 contains a small portion of code, which is customized to simulation environment 23, to obtain pin names, set pin values, and retrieve pin information. As shown, approximately 90 percent of wrapper code applies to any DSP device and any simulation environment. The remaining 10 percent is specific to the host simulation environment and may be reused for other devices in the DSP 1600 family. Together, the wrapper's ability to make the connections and isolate the simulation environment specific portions overcomes to a large extent the limitations associated with the prior art.

A visual model of the connections established during powerup of IDM 22 is shown in FIG. 3. As shown, IDM model interface 31 and simulation environment model interface 32 are aligned by arrows 33 between the two. Arrows 33 represent the signal paths between interfaces 31 and 32, and thus the mapping between IDM 22 and simulation environment 23. All of this data is stored to provide the signal mapping during evaluation IDM 22 in simulation environment 23.

The inputs 35, outputs 36 and biputs 37 of IDM interface 31 are lists of each type of pin therein. The signals are those that are applied and/or driven in/out of IDM 22. Since an IDM pin can be mapped to a single simulation environment pin or a set of simulation environment pins (e.g. for a bus), the field of IDM pins may point to a simulation environment reference list 40 for a bus or a single simulation environment reference 41 for a single pin. The IDM interface 31, in turn, points back to the IDM pin structure 44 which holds the pin information. The simulation environment model interface 32 has the same structure as the IDM model interface 31, except the simulation environment model interface 32 points to a reference 50 that contains all the pin information necessary to access the pin values of the simulation environment interface.

After the interfaces 31 and 32 are formed, IDM 22 and simulation environment 23 are then aligned. One method of alignment includes the following steps:

a. for all IDM pins, find the corresponding pin in the simulation environment's model interface;

b. if a matching simulation environment pin is found in step a, then set the IDM pins reference field to be the matching simulation environment pin;

c. if a matching simulation environment pin is not found, provide an audit message to the user performing the simulation test; and d. provide an audit message for each simulation environment pin that is not connected to the IDM interface.

Audit messages are messages that warn the user/tester that their may be a problem with the alignment that should be addressed immediately. The user, however, may ignore the audit message if the simulation they are running doesn't depend on these pins.

In the case of buses and other pins, it may be necessary to provide name mappings that provide alternate names and/or bus size information for the IDM pin name. For example, the corresponding simulation environment pin name for IDM pin name "viobit" may be "iobit". As a result, in one embodiment, the wrapper would look for a list of alternate names for the IDM name before it searched the simulation environment pin names for a match.

A "Don't Connect Pins" structure may also be implemented into an embodiment of the wrapper of the present invention, wherein the wrapper identifies IDM pins that are not to be aligned with the simulation environment interface. In such an embodiment, the wrapper would not search for a match for the names of these pins. In yet another embodiment of the wrapper of the present invention, a list of IDM pins for which the user doesn't care whether or not they are aligned with a simulation environment pin may be implemented. In such an embodiment, the wrapper would not generate an audit message if a match was not found.

After the alignment, the IDM in the simulation environment is evaluated in the simulation environment when it's inputs change. One method of performing this evaluation includes the following steps:

a. for all IDM inputs, copy data from the simulation environment's pins into the aligned IDM pins;

b. for all IDM biputs configured as inputs, copy from the simulation environment's pins into IDM pins and drives tristate onto the pin;

c. execute the IDM evaluation function;

d. for all IDM outputs which have changed, copy data from the IDM pins and drive the corresponding simulator pins; and e. for all IDM biputs configured as outputs which have changed since the last evaluation, copy the data from the IDM pin to the corresponding simulation environment pin.

The wrapper is also aimed at reducing the amount of interaction between the IDM and the simulation environment during device evaluation, and thus speed up the overall evaluation. This is mainly accomplished by only transferring data between the IDM and simulation environment when the signal at the pin has changed. Thus, the wrapper of the present invention is directed toward providing optimum performance in the evaluation of any IDM in any simulation environment.

Moreover, the wrapper of the present invention has an architecture that isolates those parts that are specific to the simulation environment. The simulation environment specific portions include: (1) simulator specific definitions/ header files; (2) powerup/initialization function (obtaining the simulation environment model interface and initializing the model); (3) and the model evaluation function (setting a pin value, retrieving a pin value, and retrieving the simulation environment current time).

Numerous modifications and alternative embodiments of the invention will be apparent to those skilled in the art in view of the foregoing description. For example, the scope of the invention is not limited to the DSP 1600 family, which is only illustrative herein for the purposes of describing the invention. The invention may be used with any microprocessor, microcontroller, DSP, or any device model. Accordingly, this description is to be construed as illustrative only, and is for the purpose of teaching those skilled in the art the best mode of carrying out the invention. Details of the structure may be varied substantially without departing from the spirit of the invention and the exclusive use of all modifications which come within the scope of the appended claim is reserved.

What is claimed is:

1. A method for integrating a device model into a simulation environment, comprising the steps of:
   interfacing with the device model and the simulation environment at device model initialization to obtain device model interface pin names and simulation environment interface pin names; and
   matching substantially each said device model pin name to a substantially similar simulation environment pin name to substantially map said device model interface to said simulation environment interface so that simulation environment signal descriptions and device model signal descriptions are translatable therebetween and providing audit messages to notify users of unmatched pin names.

2. The method of claim 1 further comprising the step of isolating predetermined parameters of the simulation environment to make the device model adaptable to multiple simulation environments.

3. The method of claim 2 wherein said parameters include simulator specific definitions, simulator header files, simulator environment clock time, and device model interface data, wherein said interface data includes pin names and reference data for each pin of said device interface.

4. The method of claim 1 wherein said interface pins include input pins, output pins and biput pins.

5. The method of claim 1 wherein said matching of said device model pins to said simulation environment pins for interface mapping comprises the steps of searching each name of said device model interface pins to find a matching pin name in said simulation environment interface, and mapping each said device model pin to said matching pin of said simulation environment.

6. The method of claim 5 wherein said matching of said device model pins to said simulation environment pins for interface mapping comprises the steps of searching each name of said simulation environment interface pins to identify a set of unmatched simulation pins having no matching name in said device model interface, and providing an audit message to notify a user of said unmatched simulation environment pins.

7. The method of claim 1 wherein said matching of said device model pins to said simulation environment pins for interface mapping comprises the steps of searching each name of said device model interface pins to identify a set of unmatched device model pins having no matching name in said simulation environment interface, and providing an audit message to notify a user of said unmatched device model pins.

8. The method of claim 7 wherein said matching of said device model pins to said simulation environment pins for interface mapping comprises the steps of searching each name of said simulation environment interface pins to identify a set of unmatched simulation pins having no matching name in said device model interface, and providing an audit message to notify a user of said unmatched simulation environment pins.

9. The method of claim 5 further comprising the step of searching a table of alternate names to identify alternate search names for said device model pin names.

10. The method of claim 5 further comprising the step of searching a list of unconnected pin names to identify device model pins that do not require matching with the simulation environment.

11. The method of claim 5 further comprising the step of searching a list of ignore-pin names to identify device model pins that do not require an audit message.

12. The method of claim 1 further comprising the step of notifying a user of pins that do not match between the model device interface and the simulation environment interface.

13. The method of claim 1 wherein said step of interfacing and said step of matching are automatically restarted upon each powerup of the device model.

14. The method of claim 1 wherein said pin matching information is stored in a device model state information data structure.

15. The method of claim 1 further comprising the step of using pin name matching information to transfer signals between said simulation environment pins and said device model pins upon a clock transition.

16. The method of claim 15 wherein said step of using said matching to transfer signals is performed only for those signals for which a change in state has occurred.

17. The method of claim 16 wherein said step of using said pin name matching to transfer signals is performed through a simulation environment routine.

18. The method of claim 1 further comprising the steps of packing simulation environment bus signals into a device model bus, and unpacking device bus signals therefrom.

19. The method of claim 1 wherein said step of interfacing for pin names is performed through a symbol table.

20. The method of claim 1 wherein logic levels of said simulator pins are mapped to logic levels of said matching device model pins.

21. A model wrapper for translating signal descriptions of a device model and a simulation environment to integrate the device model into the simulation environment to evaluate the performance of the model therein, the wrapper comprising;
   a routine for interfacing the model wrapper with the device model and the simulation environment at device model initialization/powerup to obtain device model interface pin names and simulation environment interface pin names; and
   a routine for matching substantially each said simulation environment interface pin name to a substantially similar device pin name to substantially map said device model interface to said simulation environment interface so that the simulation environment signal descriptions and device model signal descriptions are translatable therebetween and providing audit messages to notify users of unmatched pin names.

22. The wrapper of claim 21 further comprising a routine for isolating predetermined parameters of the simulation environment to make the device model adaptable to multiple simulations.

23. The wrapper of claim 22 wherein said parameters include simulator specific definitions, simulator header files, simulator environment clock time, and device model interface data, wherein said interface data includes pin names and reference data for each pin of said device interface.

24. The wrapper of claim 21 wherein said interface pins include input pins, output pins and biput pins.

25. The wrapper of claim 21 wherein said routine for matching of said device model pins to said simulation environment pins for interface mapping comprises the steps of searching for each pin of said device model interface to find a matching pin name in said simulator interface, and mapping each said device model pin to said matching pin of said simulator environment.

26. The wrapper of claim 21 wherein said routine for matching of said device model pins to said simulation environment pins for interface mapping comprises the steps of searching for each device model pin without a matching pin name in said simulator interface to provide a set of unmatched device model pins, and providing an audit message to notify a user of said unmatched device model pins.

27. The wrapper of claim 26 wherein said routine for matching of said device model pins to said simulation environment pins for interface mapping comprises the steps of searching for each simulation environment interface pin to identify a set of unmatched simulation pins, and providing an audit message to notify a user of said unmatched simulation environment pins.

28. The wrapper of claim 25 further comprising a table of alternate names to identify alternate device model pin names to search in the simulation environment.

29. The wrapper of claim 28 wherein said routine for matching of said device model pins to said simulation environment pins for interface mapping comprises the steps of searching for each simulation environment interface pin to identify a set of unmatched simulation pins, and providing an audit message to notify a user of said unmatched simulation environment pins.

30. The wrapper of claim 25 further comprising a list of ignore-pin names to identify device model pins that do not require matching with the simulation environment.

31. The wrapper of claim 25 further comprising a list of don't complain pin names to identify device model that do not require and audit message.

32. The wrapper of claim 21 further comprising a routine for notifying a user of pins that do not align between the model device interface and the simulation environment interface.

33. The wrapper of claim 21 wherein said routine for interfacing and said routine for matching routine are automatically restarted upon each powerup of the device model.

34. The wrapper of claim 21 wherein said pin matching information is stored in a device model state information data structure.

35. The wrapper of claim 21 further comprising a routine for using pin name matching information to transfer signals between said simulation environment pins and said device model pins upon a clock transition.

36. The wrapper of claim 33 wherein said routine for using said matching information to transfer signals is performed only for those signals for which a change in state has occurred.

37. The wrapper of claim 34 wherein said routine for using said pin name matching information to transfer signals is performed through a simulation environment routine.

38. The wrapper of claim 21 further comprising a routine for packing simulation environment bus signals into a device model bus, and unpacking device bus signals therefrom.

39. The wrapper of claim 21 wherein said routine for interfacing for pin names is performed through a symbol table.

40. The wrapper of claim 21 wherein logic levels of said simulator pins are mapped to logic levels of said matching device model pins.

41. A method for integrating device models into host simulation environments, the method comprising the steps of:

during powerup of the device model, querying the device model to obtain a set of device model pin names, querying the host environment to obtain a set of host pin names, comparing each said host pin name to said device model pin names to find a closest match therefore, aligning each host pin to said model pin having said closest matching name, and storing said aligning information in a data structure to establish a pin mapping between said host pins and said model pins and providing audit messages to notify users of unmatched pin names; and during evaluation of the device model, using said pin mapping to transmit data between the device model and host environment.

42. A storage medium containing a program for integrating a device model into a simulation environment, the integration comprising the steps of:

querying the device model and the simulation environment at device model initialization to obtain device model interface pin names and simulation environment interface pin names; and matching substantially each said simulation environment interface pin name to a device pin name to substantially map said device model interface to said simulation environment interface so that simulation environment signal descriptions and device model signal descriptions are translatable therebetween and providing audit messages to notify users of unmatched pin names.

43. A system having a program for integrating a device model into a simulation environment, the system comprising:

a routine for querying the device model and the simulation environment at device model initialization/powerup to obtain device model interface pin names and simulation environment interface pin names; and a routine for matching substantially each said simulation environment interface pin name to a substantially similar device pin name to substantially map said device model interface to said simulation environment interface so that simulation environment signal descriptions and device model signal descriptions are translatable therebetween and providing audit messages to notify users of unmatched pin names.

* * * * *